(12) United States Patent
Barbieri et al.

(10) Patent No.: US 9,800,212 B2
(45) Date of Patent: Oct. 24, 2017

(54) FBDDA AMPLIFIER AND DEVICE INCLUDING THE FBDDA AMPLIFIER

(71) Applicant: STMicroelectronics S.r.l., Agrate Brianza (IT)

(72) Inventors: Andrea Barbieri, Casalpusterlengo (IT); Sergio Pernici, Bergamo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 14/863,184

(22) Filed: Sep. 23, 2015

(65) Prior Publication Data

US 2016/0156319 A1   Jun. 2, 2016

(30) Foreign Application Priority Data

Nov. 28, 2014   (IT) .............................. TO2014A0987

(51) Int. Cl.
*H03G 3/00* (2006.01)
*H03F 1/32* (2006.01)
(Continued)

(52) U.S. Cl.
CPC ....... *H03F 1/3211* (2013.01); *H03F 3/45197* (2013.01); *H03F 3/45273* (2013.01);
(Continued)

(58) Field of Classification Search
CPC ........ H03G 3/20; H03G 3/3005; H03G 5/165; H03G 3/00; H04R 19/005; H04R 2201/003; H04R 2499/11
(Continued)

(56) References Cited

U.S. PATENT DOCUMENTS

| 3,617,881 A * | 11/1971 | McCormick ....... G01R 19/0023 324/123 R |
| 2014/0086433 A1* | 3/2014 | Josefsson ................. H04R 3/06 381/98 |
| 2016/0112796 A1* | 4/2016 | Yang ........................ H04R 3/00 381/122 |

FOREIGN PATENT DOCUMENTS

| EP | 0 829 955 A1 | 3/1998 |
| EP | 0 128 633 A1 | 12/2009 |

OTHER PUBLICATIONS

Alzaher et al., "A CMOS Fully Balanced Differential Difference Amplifier and Its Applications," IEEE Transactions on Circuits and Systems—II: Analog and Digital Signal Processing, 48(6), Jun. 2001, pp. 614-620.

(Continued)

*Primary Examiner* — Alexander Jamal
(74) *Attorney, Agent, or Firm* — Seed IP Law Group LLP

(57) ABSTRACT

A FBDDA amplifier comprising: a first differential input stage, which receives an input voltage; a second differential input stage, which receives a common-mode voltage; a first resistive-degeneration group coupled to the first differential input; a second resistive-degeneration group coupled to the second differential input; a differential output stage, generating an output voltage; a first switch coupled in parallel to the first resistive-degeneration group; and a second switch coupled in parallel to the second resistive-degeneration group. The first and second switches are driven into the closed state when the voltage input assumes a first value such that said first input stage operates in the linear region, and are driven into the open state when the voltage input assumes a second value, higher than the first value, such that the first input stage operates in a non-linear region.

19 Claims, 7 Drawing Sheets

(51) Int. Cl.
H03F 3/45 (2006.01)
H04R 3/00 (2006.01)
H04R 19/00 (2006.01)
H04R 19/04 (2006.01)

(52) U.S. Cl.
CPC ... *H03F 3/45708* (2013.01); *H03F 2200/261* (2013.01); *H03F 2203/45044* (2013.01); *H03F 2203/45101* (2013.01); *H03F 2203/45116* (2013.01); *H03F 2203/45136* (2013.01); *H03F 2203/45151* (2013.01); *H03F 2203/45156* (2013.01); *H03F 2203/45361* (2013.01); *H03F 2203/45492* (2013.01); *H03F 2203/45506* (2013.01); *H04R 3/00* (2013.01); *H04R 19/005* (2013.01); *H04R 19/04* (2013.01); *H04R 2201/003* (2013.01)

(58) Field of Classification Search
USPC ........ 381/107, 102, 104, 106, 108, 113, 114
See application file for complete search history.

(56) References Cited

OTHER PUBLICATIONS

Säckinger et al., "A Versatile Building Block: The CMOS Differential Difference Amplifier," *IEEE Journal of Solid-State Circuits*, SC-22(2), Apr. 1987, pp. 287-294.

Calvo et al., "Linear-enhanced V to I converters based on MOS resistive source degeneration," IEEE International Symposium on Circuits and Systems, Seattle, WA, May 18-21, 2008, pp. 3118-3121.

Duque-Carrillo et al., "Fully Differential Basic Building Blocks Based on Fully Differential Difference Amplifiers with Unity-Gain Difference Feedback," *IEEE Transactions on Circuits and Systems—1: Fundamental Theory and Applications* 42(3):190-192, Mar. 1995.

Garimella, "Highly Linear Wide Dynamic Swing CMOS Transconductance Multiplier using Source-degeneration V-I Converters," 21$^{st}$ International Conference on VLSI Design, Hyderabad, Jan. 4-8, 2008, pp. 300-304.

Leuciuc et al., "A Highly Linear Low-Voltage MOS Transconductor," IEEE International Symposium on Circuits and Systems, vol. 3, 2002, pp. III-735-III-738.

Ramirez-Angulo et al., "Rail-to-rail fully differential sample and hold based on differential difference amplifier," *Electronics Letters* 44(11):656-658, May 2008.

Deligoz et al., "A MEMS-Based Power-Scalable Hearing Aid Analog Front End," *IEEE Transactions on Biomedical Circuits and Systems* 5(3):201-213, Jun. 2011.

\* cited by examiner

FBDDA AMPLIFIER AND DEVICE INCLUDING THE FBDDA AMPLIFIER

BACKGROUND

Technical Field

The present disclosure relates to a fully balanced differential difference amplifier (FDDA or FBDDA) and to a device including the FBDDA amplifier.

Description of the Related Art

As is known, numerous types of circuits are used as front-end reading circuits for capacitive sensors. In particular, it is known to use FDDA or FBDDA amplifiers (Fully-balanced Differential Difference Amplifier), which are preferable when a high input impedance, a fully differential architecture, and unity or unit gain are required. A FBDDA amplifier of this type is shown by way of example in FIG. 1, and designated as a whole by the reference number 1. A capacitive sensor 2 belongs, for example, to a gyroscope, a pressure sensor, an accelerometer, a microphone, etc., and detects a variation of capacitance generated by a linear or rotational movement of the mobile parts of the sensor itself. The FBDDA amplifier 1 detects a variation of the inputs resulting from conversion of the desired physical quantity (e.g., pressure, rotation, acceleration, etc.) and generates at output a voltage proportional to said variation.

In the example of FIG. 1, the FBDDA amplifier 1 includes four input terminals 1a-1d and two output terminals 1e, 1f. The terminal 1a is an inverting terminal, and the terminal 1b is a non-inverting terminal. On the terminal 1b an input signal (voltage) Vin is present, including a voltage component generated by the capacitive sensor 2 and a fixed voltage component $V_{CM}$. The voltage $V_{CM}$ applied to the terminal 1b by a resistor 3, is a voltage for biasing the sensor 2, chosen according to the need for fixing the operating point of the sensor 2 ($V_{CM}$ is chosen, for example, in a range comprised between a supply voltage $V_{DD}$ and a voltage of a reference node, e.g., ground reference). The resistor 3 has a high value of resistance, for example 100 GΩ or higher. The voltage $V_{CM}$ is a fixed (d.c.) voltage and is further supplied to the input 1c of the FBDDA amplifier. In this way, the inputs of the FBDDA amplifier 1 are always biased at a common voltage, which is known. During use of the sensor 2, the varying (i.e., a.c.) input signal Vin is superimposed on the voltage $V_{CM}$.

The signal on the terminal 1a is transferred onto the output terminal 1e. In other words, the output terminal 1e is feedback-connected to the input terminal 1a. Likewise, the signal on the terminal 1d is transferred onto the output terminal 1f so that the output terminal 1f is feedback-connected to the input terminal 1d.

In a per se known manner, according to the operation of a FBDDA amplifier in voltage-follower configuration, on the output 1e the signal Vin/2 is present and on the output if the signal −(Vin/2) is present.

The embodiment of FIG. 1 guarantees good performance in terms of signal-to-noise ratio (SNR) but is deficient as regards the total harmonic distortion (THD) when the level of signal Vin increases. This is due to the fact that the operational amplifier is not connected according to a closed-loop configuration of a traditional type, and its inputs are not virtually connected together. Thus, in the presence of a high input signal Vin, the two differential pairs are markedly unbalanced, thus causing a deterioration of the linearity.

In this context, the linearity is referred to the differential-input pairs of the FBDDA amplifier, obtained by transistors. For small input signals (e.g., a.c. signals in the range between −150 mV and +150 mV, extremes included), the signal at output from the amplifier is substantially a replica, possibly amplified, of the input signal. Instead, for signals with a high peak value (e.g., a.c. signals having a peak value higher, in modulus, than approximately 200 mV), the transconductance gain of the two differential input pairs starts to differ markedly, thus generating a harmonic distortion of the output voltage signal (or differential output signal).

In order to overcome this disadvantage, it is known to use degeneration resistors 4 coupled to each differential-input pair (i.e., between 1a and 1b, and between 1c and 1d), as shown schematically in FIG. 2. This approach makes it possible to improve linearity of the output signal of the FBDDA amplifier, at the expense of noise that is the higher, the greater the degeneration resistances.

A further known solution, shown schematically in FIG. 3, envisages use of dynamic-biasing circuits 6 such that the current for biasing the differential pair is not fixed, but varies as a function of the input signal Vin. In this case, when the input signal Vin increases beyond a threshold value, a current is introduced into the differential pair. Even though this approach affords advantages in terms of input noise and harmonic distortion, it presents the disadvantage of requiring an excessive current consumption and a marked variability of the d.c. operating point.

BRIEF SUMMARY

One aim of the present disclosure is to provide a fully balanced differential difference amplifier (FBDDA) and a device including the FBDDA amplifier that will be able to overcome at least some of the negative aspects of the known art and extend functionality thereof.

According to the present disclosure a FBDDA amplifier and a device including the FBDDA amplifier are provided.

BRIEF DESCRIPTION OF THE SEVERAL VIEWS OF THE DRAWINGS

For a better understanding of the present disclosure, a preferred embodiment is now described, purely by way of non-limiting example, with reference to the attached drawings, wherein.

DETAILED DESCRIPTION

Figure 1:
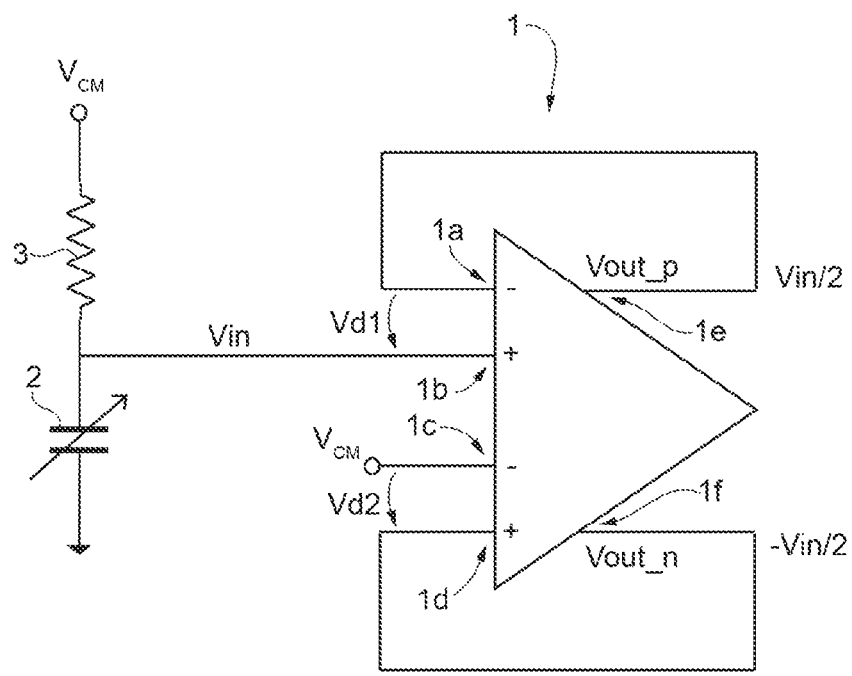
FIG. 1 shows a FBDDA amplifier according to an embodiment of a known type, coupled to a capacitive sensor.
Figure 4:
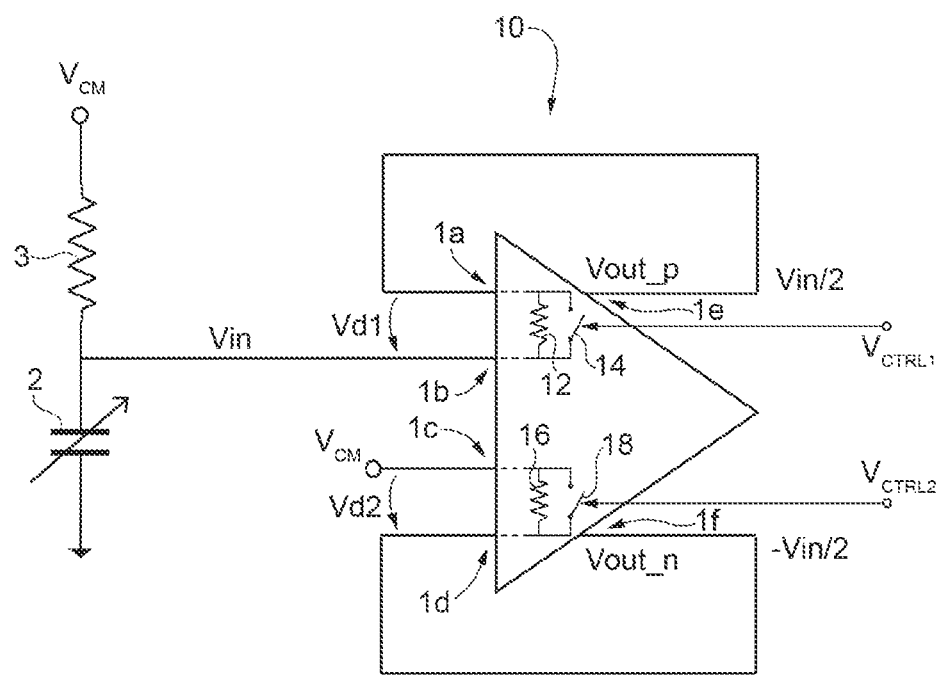
FIG. 4 shows a FBDDA amplifier according to one embodiment of the present disclosure.

FIG. 4 is a schematic representation of a FBDDA amplifier 10 according to one aspect of the present disclosure. Elements of the FBDDA amplifier 10 of FIG. 4 that are in common with those of the FBDDA amplifier 1 of FIG. 1 are designated by the same reference numbers and are not described any further.

The FBDDA amplifier 10 comprises a resistive-degeneration group 12, coupled to a first input stage of the FBDDA 10, i.e., between the input terminal 1a and the input terminal 1b, and a by-pass switch 14 coupled in parallel to the first resistive-degeneration group 12. Further, the FBDDA amplifier 10 comprises a second resistive-degeneration group 16, coupled to a second input stage of the FBDDA amplifier 10, i.e., between the input terminal 1c and the input terminal 1d, and a by-pass switch 18 coupled in parallel to the resistive-degeneration group 16. The by-pass switch 14 is driven into an open/closed state by a control signal $V_{CTRL1}$ and, likewise, the by-pass switch 18 is driven into an open/closed state by a control signal $V_{CTRL2}$.

According to one embodiment, the resistive-degeneration groups 12 and 16 are obtained by respective resistors connected together in series, and the by-pass switches 14 and 18 are obtained by respective transistors, in particular MOSFETs. In this case, the control signal $V_{CTRL1}$ is a voltage signal applied to the gate terminal of the by-pass transistor 14, and has a value such as to turn on or off the by-pass transistor 14, according to the desired operating condition. The control signal $V_{CTRL2}$ is a voltage signal applied to the gate terminal of the by-pass transistor 18, having a value such as to turn on or off the by-pass transistor 18, according to the desired operating condition.

According to the embodiment of FIG. 4, the resistive-degeneration groups 12, 16 are included in the circuit by opening the by-pass switches 14, 18 as a function of the value of the input signal Vin, and in particular at a value of Vin such that the differential inputs of the FBDDA amplifier 10 show a non-linear behavior (i.e., for high values of the signal Vin). Instead, for small signals (low value of Vin), the degeneration resistors 12, 16 are excluded by closing the by-pass switches 14 and 18.

According to one embodiment, values of the input signal Vin (a.c. signal) that may be identified as "small signal" are comprised in the range between −150 mV and +150 mV (extremes included); (peak) values of the input signal Vin such as to generate a non-linear behavior of the FBDDA amplifier 10 are higher, in modulus, than approximately 200 mV.

According to one aspect of the present disclosure, when the by-pass switches 14, 18 are implemented by transistors, the FBDDA amplifier 10 works in at least two different operating conditions. In a first, small-signal, operating condition (Vin having a first voltage value), the transistors 14 and 18 are on, by-passing the resistive-degeneration groups 12, 16. In a second operating condition, the value of the signal Vin is high (Vin having a second voltage value greater than the first voltage value) and the by-pass transistors 14 and 18 are off (theoretically infinite resistance), causing passage of the current exclusively through the resistive-degeneration groups 12, 16.

It is further possible to identify a third operating condition, with the input signal Vin having an intermediate value between the first and second values (Vin having a third voltage value greater than the first voltage value but smaller than the second voltage value); the by-pass transistors 14 and 18 are in an intermediate operating condition, where the gate-to-source voltage $V_{GS}$ is approximately equal to the threshold turn-on voltage of the respective by-pass transistor. The by-pass transistors 14 and 18 thus form a resistive path for the current that traverses them, for example comparable with the value of resistance of the respective resistive-degeneration groups 12, 16.

The by-pass transistors 14 and 18 are controlled, in the aforementioned first and second operating conditions, by control signals $V_{CTRL1}$ and $V_{CTRL2}$, respectively, which keep them both on (respective $V_{GS}$ higher than the respective threshold voltage) or both off (respective $V_{GS}$ lower than the respective threshold voltage).

The third operating condition corresponds to transition from the first operating condition to the second operating condition, and vice versa. In this condition, the transistors 14, 18 are driven by the control signals $V_{CTRL1}$ and $V_{CTRL2}$, respectively, such that the by-pass transistors 14 and 18 present a resistive behavior and show respective values of resistance that are substantially the same as one another. If it were not so, a significant difference in the value of resistance shown by the by-pass transistors 14, 18 in regard to passage of the current would entail a reduction of the linearity of the FBDDA amplifier 10.

Figure 5:
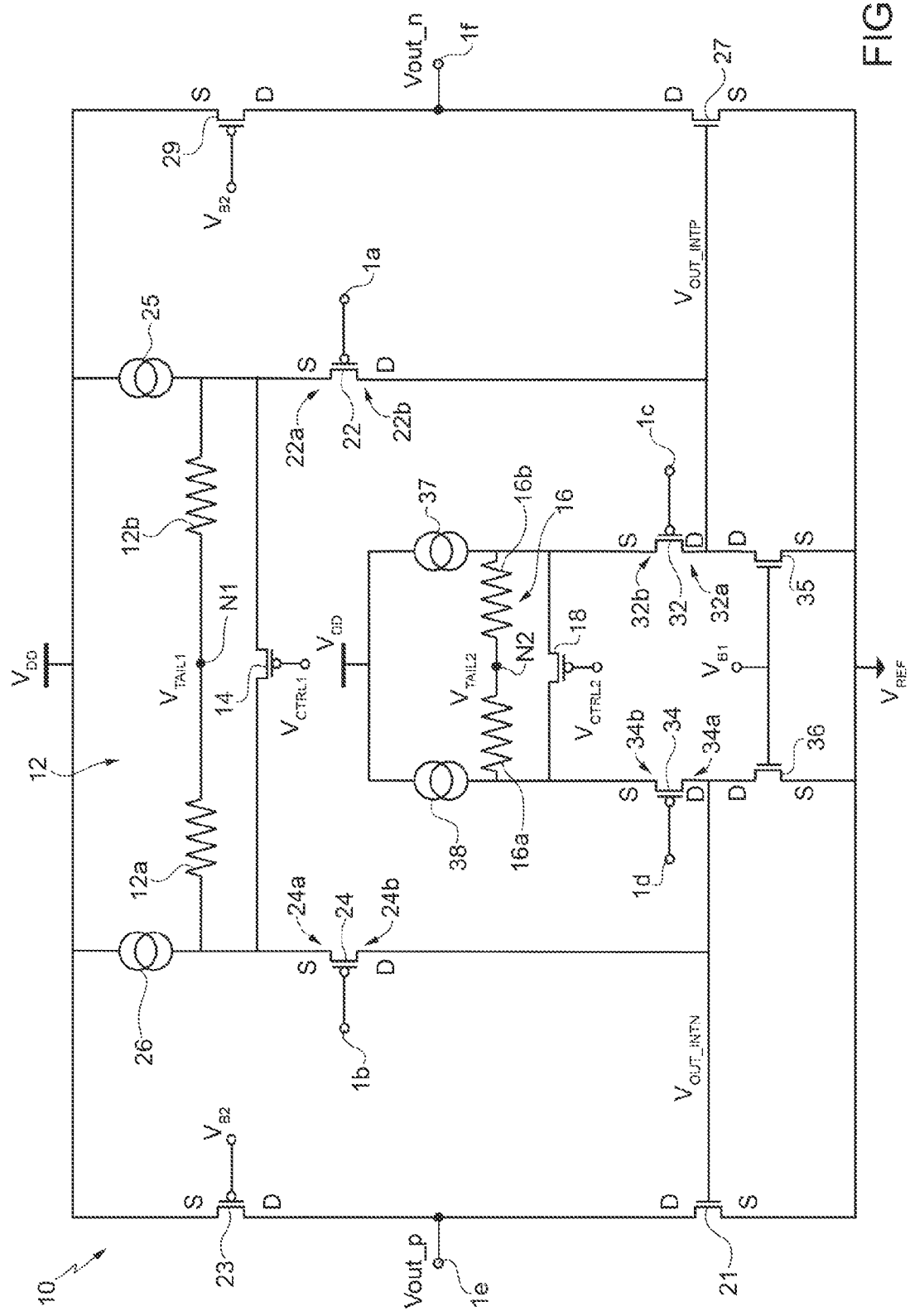
FIG. 5 shows one circuit embodiment of the FBDDA amplifier of FIG. 4.
Figure 7:
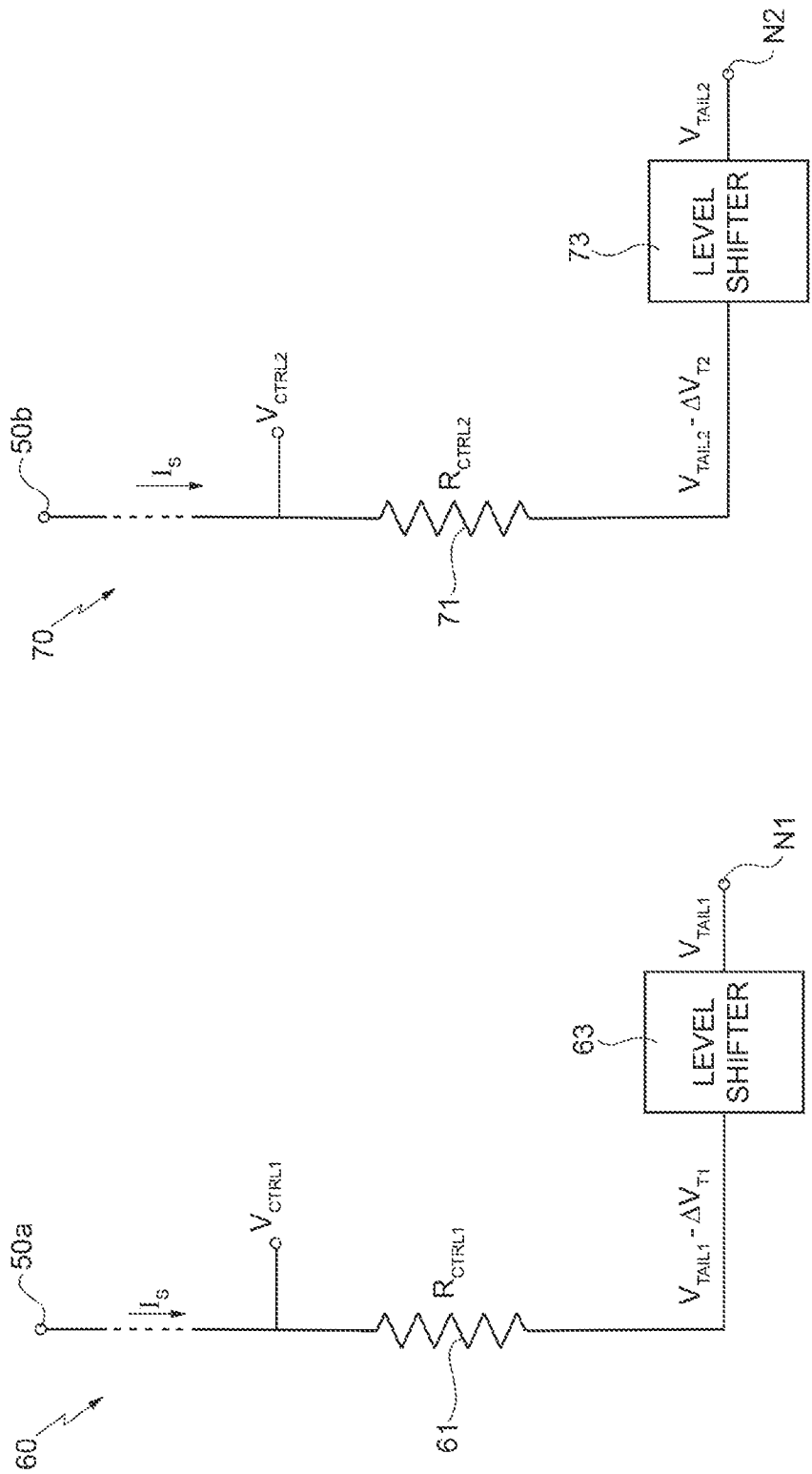
FIGS. 7A and 7B show, respectively, a second portion and a third portion of the control circuit for the FBDDA amplifier of FIG. 5.

Generation of the control signals $V_{CTRL1}$ and $V_{CTRL2}$ is obtained by the circuits of FIGS. 7A and 7B. FIG. 5 shows, in greater detail, a circuit implementation of the FBDDA amplifier 10, according to the embodiment of FIG. 4. The embodiment of the FBDDA amplifier 10 of FIG. 5 is just one of the possible embodiments of a FBDDA amplifier. Known in the art are numerous circuit embodiments in view of the present disclosure.

One aspect of the present disclosure, irrespective of the circuit embodiment chosen for the FBDDA amplifier, regards arrangement of the resistive-degeneration groups 12, 16 coupled in parallel to the by-pass switches 14, 18, and to selective inclusion of the resistive-degeneration groups 12, 16 according to different operating conditions of the FBDDA amplifier (i.e., as a function of the value of the input signal Vin).

As may be noted from FIG. 5, the differential inputs 1a, 1b are coupled to a respective gate terminal of respective input transistors, in particular P-MOSFETs, designated by the reference numbers 22 and 24, respectively.

The input transistors 22, 24 have a respective first conduction terminal (source) 22a, 24a coupled to current generators 25, 26; the latter are coupled to a power-supply terminal, at a voltage $V_{DD}$. Typical supply values $V_{DD}$ are comprised between 1.5 V and 5 V.

A second conduction terminal (drain) 24b of the input transistor 24 is coupled to the control terminal (gate) of an output gain transistor 21 (e.g., an N-MOSFET). In particular, the gate of the transistor 21 is biased by a voltage signal $V_{OUT\_INTN}$. A transistor 23 (P-MOSFET) is further connected between the power-supply terminal $V_{DD}$ and the output 1e, and the current that flows through it is driven by a predefined signal $V_{B2}$. The transistors 21 and 23 form, in part, a second amplification stage, in a per se known manner. The transistor 21 is the gain element, whereas the transistor 23 has the function of current generator.

Likewise, a second conduction terminal (drain) 22b of the input transistor 22 is coupled to the control terminal (gate) of an output gain transistor 27 (e.g., an N-MOSFET). In particular, the gate of the transistor 27 is biased by a voltage signal $V_{OUT\_INTP}$. A transistor 29 (P-MOSFET) is further connected between the power-supply terminal $V_{DD}$ and the output 1f, and the current that flows through it is driven by the signal $V_{B2}$. The transistors 27 and 29 form, in part, the second amplification stage, in a per se known manner. The transistor 27 is the gain element, whereas the transistor 29 has the function of current generator.

The transistors 23 and 29 may, thus, be represented schematically as generic current generators and have the sole function of setting an operating point for balancing of the currents in the branches considered.

The supply voltage $V_{DD}$ is, for example, supplied by a battery, not shown in the figures. Coupled between the power-supply node $V_{DD}$ and the second conduction terminal of each input transistor 22, 24 is, in FIG. 5, a respective current generator 25, 26, which identifies the current that flows, in use, in the respective input branch of the FBDDA amplifier 10, in a per se known manner.

According to one aspect of the present disclosure, coupled between the first conduction terminal 22a of the input transistor 22 and the first conduction terminal 24a of the input transistor 24 are the resistive-degeneration group 12 and the by-pass switch 14. In this example, the resistive-degeneration group 12 is formed by two resistors 12a and 12b, connected together in series, and the by-pass switch 14 is implemented by a P-MOSFET, having a control terminal (gate) biased by the voltage VCTRL1.

The inputs 1c and 1d are coupled to a respective gate terminal of respective P-MOSFETs designated by the reference numbers 32 and 34, respectively.

A respective first conduction terminal 32a, 34a of the input transistors 32, 34 is coupled to a reference terminal (e.g., ground reference) at voltage Vref (e.g., 0 V), via a respective N-MOSFET 35, 36, having the respective gate terminal biased at a predefined and fixed voltage $V_{B1}$, having a value such as to keep the transistors 35 and 36 in the on state. The transistors 35 and 36, which may be represented as generic current generators, have the function of setting an operating point for balancing of the currents.

A respective second conduction terminal 32b, 34b of the input transistors 32, 34 is coupled to the power-supply node $V_{DD}$. Coupled between the second conduction terminal of each input transistor 32, 34 and the power-supply node $V_{DD}$ is a respective current generator 37, 38, which identifies the current that flows, in use, in the respective input branch of the FBDDA amplifier 10, in a per se known manner.

Coupled between the second conduction terminal 32b of the input transistor 32 and the second conduction terminal 34b of the input transistor 34 are the resistive-degeneration group 16 and the by-pass switch 18. In this example, the resistive-degeneration group 16 is formed by two resistors 16a and 16b, connected together in series, and the by-pass switch 18 is implemented by a P-MOSFET, having a control terminal (gate) biased by the voltage VCTRL2.

Figure 6:
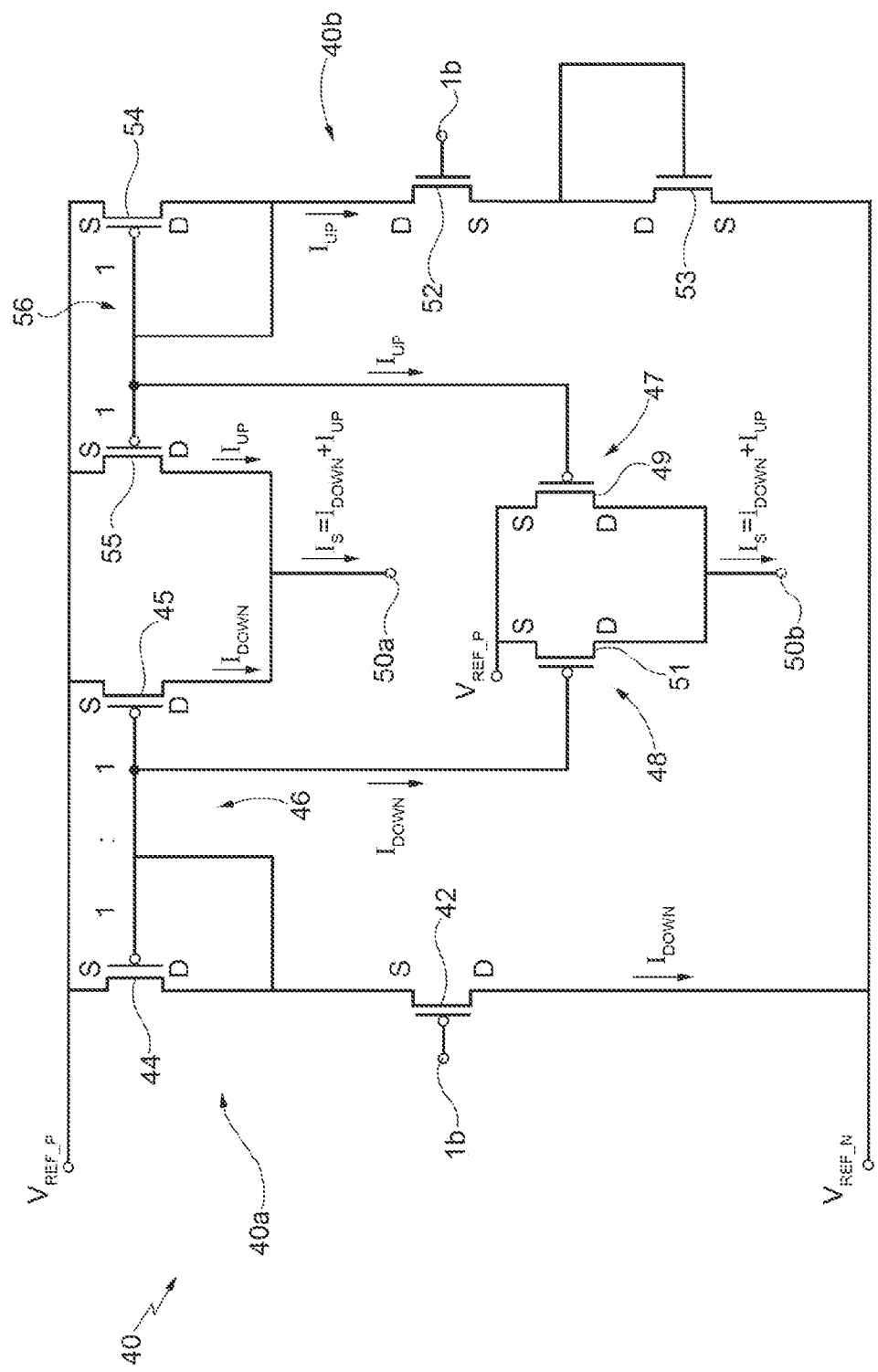
FIG. 6 shows a first portion of a control circuit for the FBDDA amplifier of FIG. 5.

With reference to FIGS. 6, 7A, and 7B respective sub-circuits used for generation of the control voltages $V_{CTRL1}$ and $V_{CTRL2}$ are now described.

With reference to FIG. 6, a circuit 40 is shown for generation of a control current $I_S$, which is supplied to the circuits of FIGS. 7A and 7B. The current $I_S$ has a value that will depend upon the value of the input signal Vin, as described in what follows. The circuit 40 comprises a transistor 42, in particular a P-MOSFET, having a control terminal (gate) coupled to the input 1b of the FBDDA amplifier 10, i.e., that receives the input signal Vin. A first conduction terminal (drain) of the transistor 42 is coupled to a node at reference voltage $V_{REF\_N}$, whereas a second conduction terminal (source) of the transistor 42 is coupled to a node at reference voltage $V_{REF\_P}$, where the voltage value of $V_{REF\_P}$ is greater than the respective voltage value of $V_{REF\_N}$. According to one embodiment, the voltage $V_{REF\_P}$ corresponds to the supply voltage $V_{DD}$, and the voltage $V_{REF\_N}$ corresponds to the reference voltage $V_{REF}$ of FIG. 5, for example ground voltage.

In greater detail, the second conduction terminal of the transistor 42 is coupled to the node $V_{REF\_P}$ by a transistor 44, which is again a P-MOSFET and forms, together with a further transistor 45, in particular a P-MOSFET, a first current mirror 46. The gate and drain terminals of the transistor 44 are connected together and to the source terminal of the transistor 42. Further, according to the current-mirror configuration, the gate terminals of the transistors 44 and 45 are connected together. The source terminals of the transistors 44 and 45 are connected to the node $V_{REF\_P}$ (e.g., $V_{DD}$). The transistor 42 and the current mirror 46 form a first branch 40a of the circuit 40, through which a current $I_{DOWN}$ flows, in use. The current mirror 83 has a gain ratio 1:1 (but could even have another ratio 1:M, if need be), and has the function of generating the current $I_{DOWN}$ at an adder node 50a, in the drain terminal of the transistor 45.

The first branch 40a thus converts the voltage Vin on the input terminal 1b into a current signal $I_{DOWN}$, proportional to the voltage $V_{in}$, when the voltage Vin on the input node 1b drops below the value $V_{REF\_P}-2V_{TH\_P}$, where $V_{TH\_P}$ is the threshold voltage of the transistors 42 and 44.

The threshold $V_{TH\_P}$ depends upon the technology and usually varies between 0.5 V and 0.7 V. For example, if we assume that we have $V_{TH\_P}$=0.6 V, $V_{DD}$=2 V and $V_{CM}$=1 V, there is generation of current when the voltage Vin on the input node 1b is lower than 0.8 V ($V_{DD}-2_{VTH\_P}$). Since the voltage Vin on the input node 1b may be viewed as the sum of the (d.c.) voltage $V_{CM}$ and the a.c. voltage supplied by the capacitive sensor 2, there is obtained generation of the current $I_{DOWN}$ when the a.c. component of $V_{IN}$ is lower than −200 mV (i.e., $V_{CM}+V_{IN}<0.8V$).

A second branch 40b of the circuit 40 comprises a transistor 52, for example an N-MOSFET, having a control terminal (gate) biased by the input signal Vin, as has been described with reference to the transistor 42. The source terminal of the transistor 52 is coupled to the node at voltage $V_{REF\_N}$ by a transistor 53, for example an N-MOSFET, whereas the drain terminal of the transistor 52 is coupled to the node at voltage $V_{REF\_P}$ by a transistor 54, for example a P-MOSFET.

The transistor 54 forms part of a second current mirror 56, which further comprises a transistor 55, for example a P-MOSFET, having the gate terminal connected to the gate terminal of the transistor 54. The transistor 55 is coupled between the node at voltage $V_{REF\_P}$ and the adder node 50a.

As in the case of the branch 40a, the branch 40b converts the signal present on the input 1b into a current signal $I_{UP}$ when the a.c. component of the voltage $V_{IN}$ rises above $V_{REF\_N}+2_{VTH\_N}$, thus turning on the transistors 52 and 53. This current is injected into the node 50a of the second current mirror constituted by the transistors 54 and 55. Thus, the current $I_{UP}$ that flows through the second branch 40b of the circuit 40, between the nodes $V_{REF\_P}$ and $V_{REF\_N}$, is sent to the adder node 50a, as in the case of the current $I_{DOWN}$ that flows through the first branch 40a.

The second branch 40b, thus, converts the voltage Vin on the input terminal 1b into a current signal $I_{UP}$, proportional to the voltage Vin, when the voltage Vin on the input node 1b rises above the value $V_{REF\_N}+2V_{TH\_N}$, where $V_{TH\_N}$ is the threshold voltage of the transistors 52 and 53.

The threshold $V_{TH\_N}$, as in the case described for $V_{TH\_P}$, depends upon the technology and usually varies between 0.5 V and 0.7 V.

For example, if we assume that $V_{TH\_N}=0.6$ V, $V_{REF\_N}=0$ V and $V_{CM}=1$ V, there is generation of current when the voltage on the input 1b is higher than 1.2V ($V_{REF\_N}+2_{VTH\_N}$). Since the signal on the input 1b may be viewed as the sum of the d.c. component of $V_{CM}$ and the a.c. component of $V_{IN}$, there is generation of the current $I_{DOWN}$ when the a.c. component of $V_{IN}$ has a peak value higher than 200 mV ($V_{CM}+V_{IN}>1.2V$).

Since the current $I_S$ is supplied irrespective of whether the circuit of FIG. 7A or the circuit of FIG. 7B is used, further current mirrors 47, 48 are provided, where the current mirror 47 comprises the transistor 54 and a transistor 49, and the current mirror 48 comprises the transistor 44 and a transistor 51. Operation of the current mirrors 47, 48 is similar to what has been described with reference to the current mirrors 46 and 56, for generation of the current $I_S$ at an adder node 50b.

It is here pointed out that the conditions for generation of the currents $I_{DOWN}$ and $I_{UP}$ are opposite to one another, and thus, in use, present on the adder node 50a is alternatively just one between the current $I_{DOWN}$ and the current $I_{UP}$, according to the sign of the input voltage Vin.

The (input) node 1b always oscillates around $V_{CM}$ both for small signals and for large signals. The value of the common-mode voltage $V_{CM}$ is chosen in such a way that the transistors 42, 44 of the first branch 40a and the transistors 52, 53 of the second branch 40b remain in the off state in the presence of a zero input voltage signal Vin (this condition is satisfied when $V_{CM}>V_{REF\_P}-2V_{TH\_P}$ and $V_{CM}<V_{REF\_N}+2V_{TH\_N}$); in this operating condition, the current $I_S$ at the adder node 50a is substantially zero. Instead, as the value of the voltage Vin increases as a result of operation of the capacitive sensor 2, the current $I_S$ at the adder node 50a increases, assuming a value that is the higher, the greater the value of the voltage signal Vin (up to a saturation value).

With reference to FIGS. 7A and 7B, there now follows a description of two circuits 60 and 70 for generation of the control signals $V_{CTRL1}$ and $V_{CTRL2}$, respectively, using the current signal $I_S$ generated by the circuit 40 of FIG. 6.

With reference to FIG. 7A, the current $I_S$ is supplied through a control resistor 61, having a value of resistance $R_{CTRL1}$ of, for example, 400 kΩ. Across the resistor $R_{CTRL1}$ a difference of potential is present given by $I_S \cdot R_{CTRL1}$. The intermediate voltage $V_{TAIL1}-\Delta V_{T1}$ is generated by a level shifter 63. The level shifter 63 receives at an input the voltage $V_{TAIL1}$ present between the resistors 12a and 12b of FIG. 5 (node N1 in FIG. 5) and generates at output an intermediate voltage that has a value equal to $V_{TAIL1}$ reduced by a value $\Delta V_{T1}$.

The control voltage $V_{CTRL1}$ is given by the sum of the intermediate voltage $V_{TAIL1}-\Delta V_{T1}$ and of the voltage across the resistor 61 generated as a result of the current $I_S$. As has been said previously, for small signals, i.e., for values of current $I_S$ substantially zero, the value of $V_{CTRL1}$ is approximately $V_{TAIL1}-\Delta V_{T1}$, and the by-pass transistor 14 is driven into the on state, in order to exclude the resistive-degeneration group 12. Thus, the value of shift $\Delta V_{T1}$ of the signal $V_{TAIL1}$ is chosen such that the value of the control voltage $V_{CTRL1}$, when the current $I_S$ is zero, is such as to drive the by-pass transistor 14 into the on state (it is here recalled that the by-pass transistor 14 is, in the example shown, of a P type). As the value of the input signal Vin increases, also the current $I_S$ increases, as has been described previously. Consequently, also the control voltage $V_{CTRL1}$ increases, as a result of passage of the current $I_S$ through the resistor 61. In these conditions, the by-pass transistor 14 is progressively turned off, thus including gradually the resistive-degeneration group 12 only for values of the signal Vin that are sufficiently high.

By way of example, values of the a.c. component of Vin such that the by-pass transistor 14 operates in the linear region are comprised between 0.15 V and 0.2 V. Values of the a.c. component of Vin such that the by-pass transistor 14 is off are greater than 0.2 V.

The circuit 70 for generation of the control signal $V_{CTRL2}$ is similar to the circuit 60 of FIG. 7A. In particular, the circuit 70 comprises a control resistor 71, having a value of resistance $R_{CTRL2}$ of, for example, 400 kΩ, and a voltage level shifter 73.

In the case of the circuit 70, the voltage value $V_{TAIL2}$ at input to the level shifter 73 is picked up between the resistors 16a and 16b of FIG. 5 (node N2 in FIG. 5), while the level shifter 73 carries out a reduction of said voltage value $V_{TAIL2}$, generating at output the intermediate voltage $V_{TAIL2}-\Delta V_{T2}$.

The control voltage $V_{CTRL2}$ is given by the sum of the intermediate voltage $V_{TAIL2}-\Delta V_{T2}$ and of the voltage across of the resistor 71 generated as a result of the current $I_S$. As has been said previously, for small signals, i.e., for values of current $I_S$ that are substantially zero, the value of the voltage $V_{CTRL2}$ is approximately equal to $V_{TAIL2}-\Delta V_{T2}$, and the by-pass transistor 18 is driven into the on state in order to exclude the resistive-degeneration group 16. Thus, the shift value $\Delta V_{T2}$ of the signal $V_{TAIL2}$ is chosen such that the value of the control voltage $V_{CTRL2}$, when the current $I_S$ is zero, is such as to drive the by-pass transistor 18 into the on state (it is here recalled that the by-pass transistor 18 is, in the example shown, of a P type). As the value of the input signal Vin increases, also the current $I_S$ increases, as described previously. Consequently, also the control voltage $V_{CTRL2}$ increases, as a result of passage of the current $I_S$ through the resistor 71. In these conditions, the by-pass transistor 18 is turned progressively off, thus including the resistive-degeneration group 16 only for values of the signal Vin that are sufficiently high.

In order to guarantee that during transition between one operating condition and the other the by-pass transistors 14 and 18 have the same equivalent resistance, it is expedient for the branches 60 and 70 to be the same as one another as much as possible for having $\Delta V_{T1}=\Delta V_{T2}$ and $R_{CTRL1}=R_{CTRL2}$. In this way, we have $V_{CTRL1}-V_{TAIL1}=V_{CTRL2}-V_{TAIL2}$.

By way of example, values of Vin such that the by-pass transistor 18 operates in the linear region are comprised between 0.15 V and 0.2 V. Values of Vin such that the by-pass transistor 18 is off are higher than 0.2 V.

Figure 8:
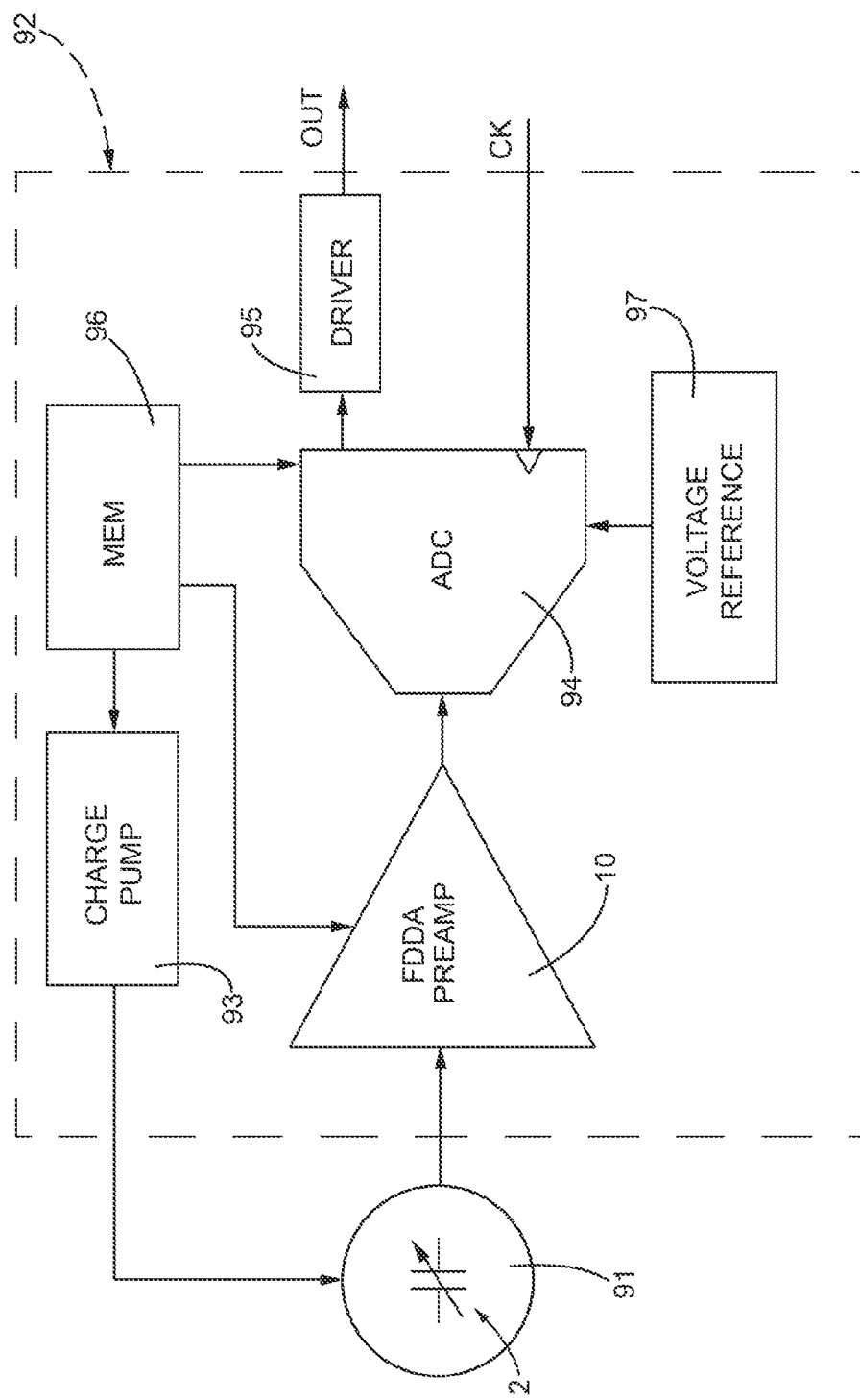
FIG. 8 shows an electronic device including the FBDDA amplifier of FIG. 4, in particular for processing the signal generated by a capacitive sensor.

The characteristics outlined previously render use of the FBDDA amplifier 10 particularly advantageous in a MEMS microphone 90, as shown in FIG. 8.

FIG. 8 shows the MEMS microphone 90, comprising two different blocks: a mechanical block 91, basically constituted by a sensor 2 sensitive to acoustic stimuli (obtained by at least two electrodes, one of which is mobile), and a signal-processing block 92 (ASIC) configured to appropriately bias the sensor and to appropriately process the electrical signal generated by the sensor 2 in order to produce on an output of the MEMS microphone 90 an analog or digital signal.

The signal-processing block 92 in turn comprises a plurality of functional sub-blocks. In particular, the signal-processing block 92 comprises: a charge pump 93, which enables generation of a suitable voltage for biasing the sensor of the mechanical block 91; a FBDDA amplifier 10 (preamplifier), configured to amplify the electrical signal generated by the sensor, obtained according to what has been described previously; an analog-to-digital converter 94, for example of a sigma-delta type, configured to receive the electrical signal amplified by the FBDDA amplifier 10, of an analog type, and convert it into a digital signal; the reference-signal generator circuit 97 according to the present disclosure, connected to the analog-to-digital converter 94; and a driver 95, configured to function as interface between the analog-to-digital converter 94 and an external system, for example a microcontroller.

Further, the MEMS microphone 90 may comprise a memory 96 (whether of a volatile or nonvolatile type), for example programmable from outside for enabling use of the MEMS microphone 90 according to different configurations (for example, different gain configurations).

Figure 9:
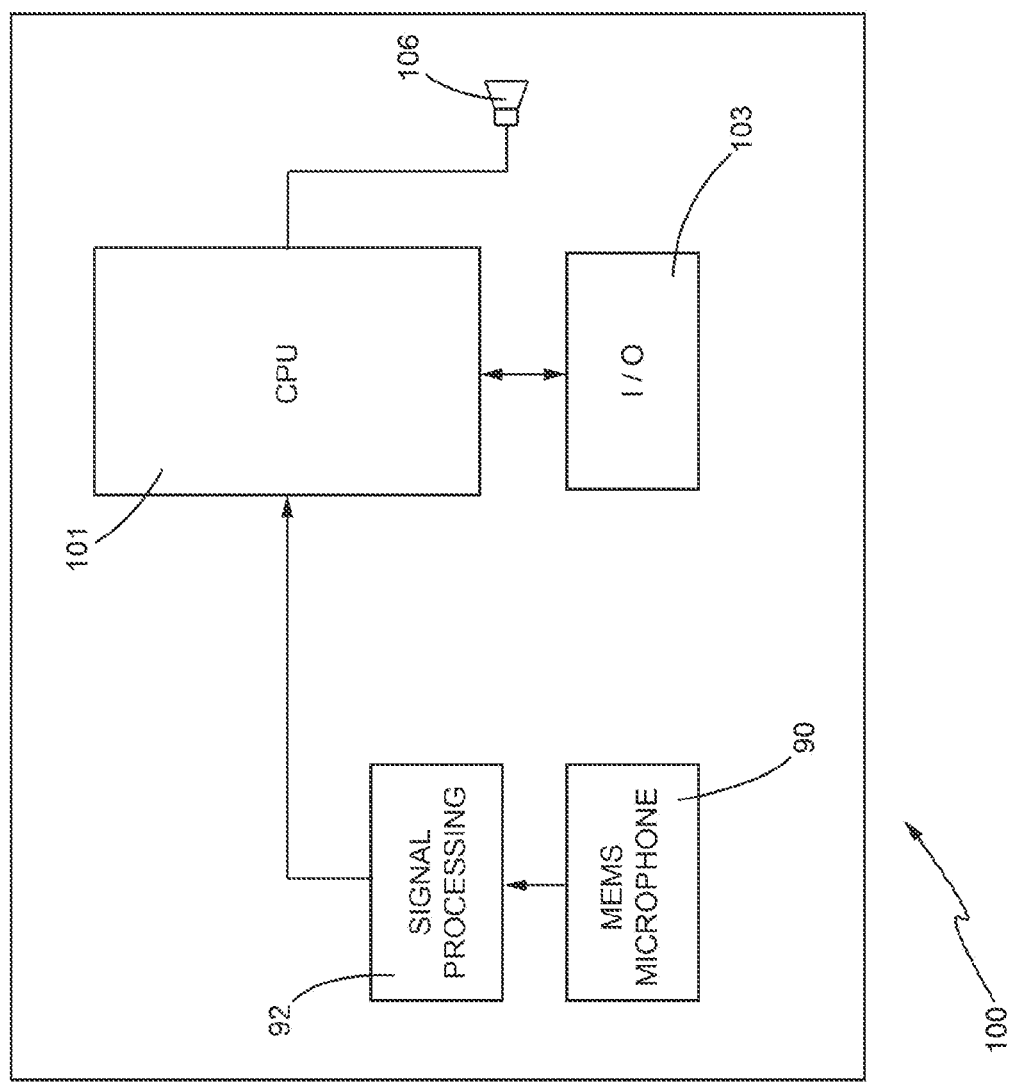
FIG. 9 shows a system including the electronic device of FIG. 8.

The characteristics listed above render particularly advantageous use of the MEMS microphone 90 in an electronic device 100, as shown in FIG. 9 (said electronic device 100 may possibly comprise further MEMS microphones, in a way not illustrated). The electronic device 100 is preferably a mobile communication device, such as, for example, a cellphone, a PDA, a notebook, but also a voice recorder, a reader of audio files with voice-recording capacity, etc. Alternatively, the electronic device 100 may be a hydrophone, able to work under water, or else a hearing-aid device.

The electronic device 100 comprises a microprocessor 101 and an input/output interface 103, for example provided with a keyboard and a display, which is also connected to the microprocessor 101. The MEMS microphone 90 communicates with the microprocessor 101 via the signal-processing block 92. Further, a speaker 106 may be present, for generating sounds on an audio output (not shown) of the electronic device 100.

From an examination of the characteristics of the embodiments obtained according to the present disclosure the advantages that it affords are evident.

Figure 2:
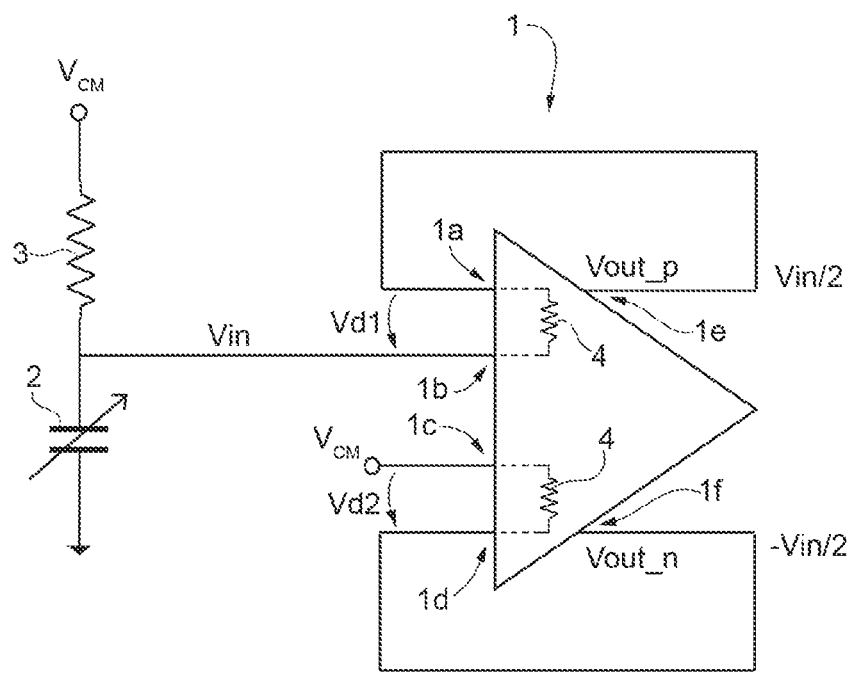
FIG. 2 shows a FBDDA amplifier according to a further embodiment of a known type, including degeneration resistors coupled to the inputs for improving linearity of the output signal.
Figure 3:
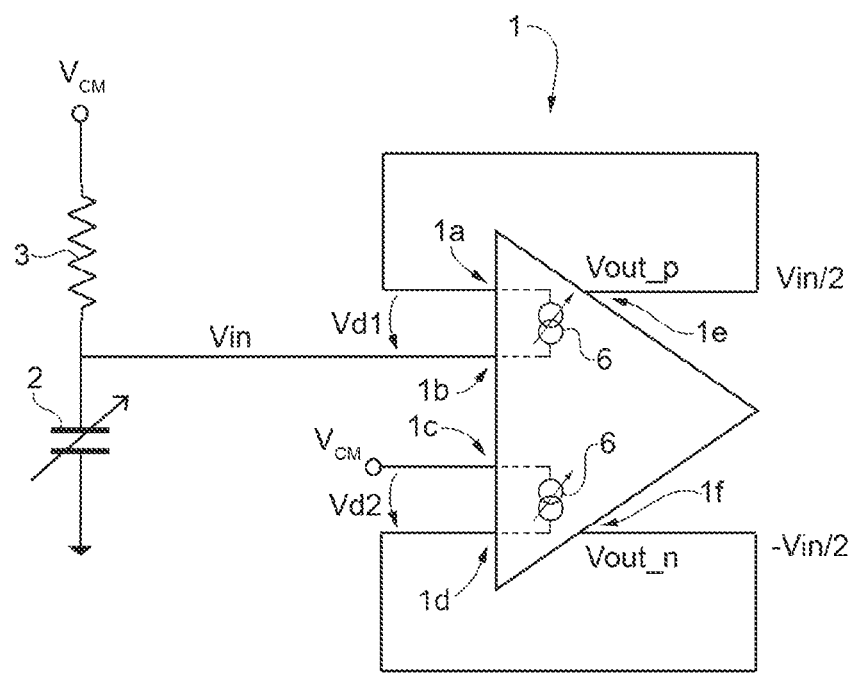
FIG. 3 shows a FBDDA amplifier according to a further embodiment of a known type, with dynamic biasing of the inputs for improving linearity of the output signal.

In particular, according to the present disclosure, a FBDDA amplifier is provided with resistive dynamic degeneration that is activated only in the presence of input signals with a high value, for which usually the requirements on the acceptable noise are less stringent than in the case of small input signal. The total harmonic distortion (THD) is thus reduced as compared to the known art, in particular as compared to the embodiment of FIG. 2.

Finally, it is clear that modifications and variations may be made to the disclosure described and illustrated herein, without thereby departing from the scope thereof, as defined in the annexed claims.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A fully balanced differential difference amplifier, comprising:
    a first differential input stage including a first input terminal and a second input terminal, the first differential input stage configured to receive an input voltage signal including a varying component and a fixed component across the first and second input terminals;
    a second differential input stage including a third input terminal and a fourth input terminal, the second differential input stage configured to receive a fixed common-mode voltage signal, said fixed component of the input voltage signal being said fixed common-mode voltage signal;
    a first resistive-degeneration group coupled to the first input terminal and the second input terminal of the first differential input stage;
    a second resistive-degeneration group coupled to the third input terminal and the fourth input terminal of the second differential input stage;
    a differential output stage coupled to the first and second differential input stages and configured to supply an output voltage signal;
    a first switch coupled to the first input terminal and the second input terminal of the first differential input stage in parallel to the first resistive-degeneration group;
    a second switch coupled to the third input terminal and the fourth input terminal of the second differential input stage in parallel to the second resistive-degeneration group; and
    wherein said first and second switches are configured to close to bypass the first and second resistive-degeneration groups in a first operating condition responsive to said input voltage signal having a first value, and are configured to open during a second operating condition responsive to said input voltage signal having a second value that is higher than the first value to thereby reduce a harmonic distortion of the output voltage signal.

2. The fully balanced differential difference amplifier according to claim 1 wherein said first value of the input voltage signal is a value of the varying component of the input signal between approximately −150 mV and +150 mV, and said second value of the input voltage signal is a value of the varying component of the input signal higher, in modulus, than approximately 200 mV.

3. The fully balanced differential difference amplifier according to claim 1, wherein said differential output stage includes a first output terminal and a second output terminal, said first output terminal being coupled in negative feedback with the first input terminal, and said second output terminal being coupled in negative feedback with the fourth input terminal, said second input terminal being configured to receive the input voltage signal, and said third input terminal being configured to receive the common-mode voltage signal.

4. The fully balanced differential difference amplifier according to claim 1, further comprising:
    a first control circuit configured to receive the input voltage signal and generate, as a function of the input voltage signal, a first control signal configured to close the first switch when the input voltage signal has the first value and to open the first switch when the input voltage signal has the second value; and
    a second control circuit configured to receive the input voltage signal and generate, as a function the input voltage signal, a second control signal configured to close the second switch when the input voltage signal has the first value and to open the second switch when the input voltage signal has the second value.

5. The fully balanced differential difference amplifier according to claim 4 wherein the first resistive-degeneration group includes a first degeneration resistor serially coupled to a second degeneration resistor and defining a first intermediate node in between one another, and the second resistive-degeneration group includes a third degeneration resistor serially coupled to a fourth degeneration resistor and defining a second intermediate node in between one another,
wherein the first control circuit is further configured to receive a first intermediate voltage signal present at the first intermediate node and generate said first control signal as a function of the value of the input voltage signal and the value of the first intermediate voltage signal, and
wherein the second control circuit is further configured to receive a second intermediate voltage signal present at the second intermediate node and generate the second control signal as a function of the value of the input voltage signal and the value of the second intermediate voltage signal.

6. The fully balanced differential difference amplifier according to claim 4 wherein:
the first control circuit comprises a first sub-circuit for conversion of the input voltage signal into a control-current signal, and a second sub-circuit for conversion of the control-current signal into the first control voltage; and
the second control circuit comprises a third sub-circuit for conversion of the control-current signal into the second control voltage.

7. The fully balanced differential difference amplifier according to claim 6 wherein:
the first control circuit comprises a first level shifter coupled to the first intermediate node to receive the first intermediate voltage signal and to output a first signal shifted by a first amount such that, during the first operating condition, the first control signal has a value configured to close the first switch; and
the second control circuit comprises a second level shifter coupled to the second intermediate node to receive the second intermediate voltage signal and to output a second signal shifted by a second amount such that, during the first operating condition, the second control signal has configured to close the second switch.

8. The fully balanced differential difference amplifier according to claim 7 wherein:
the first control circuit comprises a first resistive element configured to be traversed by said control current and to co-operate for generating, during the second operating condition, the first control signal in such a way that the first control signal has a value adapted to open the first switch; and
the second control circuit comprises a second resistive element, which is configured to be traversed by said control current and to co-operate for generating, during the second operating condition, the second control signal in such a way that the second control signal has a value adapted to open the second switch.

9. The fully balanced differential difference amplifier according to claim 8 wherein said first control signal is the sum of the voltage value generated by said first resistive element when traversed by said control current and the voltage value of the first shifted signal, and wherein said second control signal is the sum of the voltage value generated by said second resistive element when traversed by said control current and of the voltage value of the second shifted signal.

10. An electronic device, comprising:
signal-processing block circuitry configured to bias a capacitive sensor and acquire an input voltage signal generated at an output by the capacitive sensor, said signal-processing circuitry including:
a charge pump configured to bias the capacitive sensor;
a fully balanced differential difference amplifier configured to receive the input voltage signal from the capacitive sensor and to generate an output voltage signal that is a function of the input voltage signal, the fully balanced differential difference amplifier including,
a first differential input stage circuit including a first input node and a second input node, the first differential input stage configured to receive the input voltage signal from the capacitive sensor on the first and second input nodes, the input voltage signal including an a.c. component and a d.c. component;
a second differential input stage circuit including a third input node and a fourth input node, the second differential input stage circuit configured to receive a d.c. common-mode voltage signal, the d.c. component of the input voltage signal being equal to the common-mode voltage signal;
a first resistive-degeneration group circuit coupled across the first and second input nodes of the first differential input stage;
a second resistive-degeneration group circuit coupled across the third and fourth input nodes of the second differential input stage; and
a differential output stage circuit configured to generate an output voltage signal;
a first switch circuit coupled across the first input node and the second input node in parallel with the first resistive-degeneration group circuit;
a second switch circuit coupled across the third input node and the fourth input node in parallel with the second resistive-degeneration group circuit;
wherein the first and second switch circuits are configured to operate in a closed state to bypass the first and second resistive-degeneration group circuits based upon the input voltage signal having a first value, and the first and second switch circuits configured to operate in an open state so the first and second resistive-degeneration group circuits are not bypassed based upon the input voltage signal having a second value that is greater than the first value; and
an analog-to-digital converter configured to receive the output voltage signal generated by the fully balanced differential difference amplifier and to convert the output voltage signal into a corresponding output voltage digital signal.

11. The electronic device according to claim 10 wherein the capacitive sensor comprises an acoustic transducer configured to generate an electrical detection signal as a function of a received acoustic wave.

12. The electronic device according to claim 11 wherein the acoustic transducer comprises a MEMS microphone of a capacitive type.

13. The electronic device according to claim 10 wherein the electronic device comprises one of a cellphone, a PDA, a notebook, a voice recorder, an audio reader with voice-recording functions, a console for videogames, a hydrophone, and a hearing-aid device.

14. A method of controlling a fully balanced differential difference amplifier, comprising:
receiving an input voltage signal on a first differential input of a first differential input stage including the first differential input and a second differential input, the input voltage signal including a quiescent component and a varying component;
receiving a common-mode voltage signal on a first differential input of a second differential input stage including the first differential input and a second differential input, the common-mode voltage signal having a value corresponding to the quiescent component of the input voltage signal;
coupling a first resistance across the first and second differential inputs of the first differential input stage and a second resistance across the first and second differential input of the second differential input stage responsive to the input voltage signal having a first value so the first differential input stage operates in a non-linear region; and
by-passing the first resistance and the second resistance responsive to the input voltage signal having a second value that is less than the first value so the first differential input stage operates in a linear region.

15. The method of controlling a fully balanced differential difference amplifier according to claim 14 wherein by-passing the first resistance and the second resistance comprises closing a first switch and a second switch coupled in parallel with the first and second resistances, respectively.

16. The method of controlling a fully balanced differential difference amplifier according to claim 14 wherein said first value of the input voltage signal is a value of the varying component of the input voltage signal greater than approximately 200 mV and the second value of the input voltage signal is a value of the varying component of the input voltage signal between approximately −150 mV and +150 mV.

17. The method of controlling a fully balanced differential difference amplifier according to claim 16, further comprising coupling a third resistance in parallel with the first resistance and a fourth resistance in parallel with the second resistance responsive to the varying component of the input voltage signal being between the first and second values.

18. The method of controlling a fully balanced differential difference amplifier according to claim 14, further comprising generating the input voltage signal responsive to one of an acceleration, a pressure and an acoustic wave.

19. The method of controlling a fully balanced differential difference amplifier according to claim 14, further comprising generating the input voltage signal responsive to a varying capacitance value.

* * * * *